United States Patent [19]

Noguchi et al.

[11] 4,272,834
[45] Jun. 9, 1981

[54] DATA LINE POTENTIAL SETTING CIRCUIT AND MIS MEMORY CIRCUIT USING THE SAME

[75] Inventors: Yoshio Noguchi; Tsuneo Ito, both of Kodaira, Japan

[73] Assignee: Hitachi, Ltd., Tokyo, Japan

[21] Appl. No.: 81,370

[22] Filed: Oct. 3, 1979

[30] Foreign Application Priority Data

Oct. 6, 1978 [JP] Japan .................. 53/22616
Jul. 11, 1979 [JP] Japan .................. 54/86927

[51] Int. Cl.³ .................. G11C 11/40; G11C 13/00
[52] U.S. Cl. .................. 365/230; 307/238.3; 365/174; 365/189
[58] Field of Search .................. 365/154, 155, 156, 174, 365/189, 230; 307/238

[56] References Cited

U.S. PATENT DOCUMENTS 4,209,851 6/1980 Ponder .................. 365/189

Primary Examiner—Terrell W. Fears
Attorney, Agent, or Firm—Craig and Antonelli

[57] ABSTRACT

A potential setting circuit is connected with a pair of common data lines which are made operative to receive data signals from memory cells. The potentials at the paired common data lines, which are forcibly set by the potential setting circuit, are set substantially at the middle level between the high and low levels of the data signals which are generated from the memory cells. As a result, the potential at the paired common data lines are changed within a relatively short time to the level of the data signals generated from the memory cells.

17 Claims, 20 Drawing Figures

A

B

C

D

E

F

DATA LINE POTENTIAL SETTING CIRCUIT AND MIS MEMORY CIRCUIT USING THE SAME

BACKGROUND OF THE INVENTION

The present invention relates to a data line potential setting circuit, and more specifically a data line potential setting circuit for use in an MIS memory circuit, which is composed of insulate gate field effect transistors (which will be shortly referred to as "MIS FET").

In an MIS memory circuit for feeding the data signals to be written, which are generated by a write circuit, through a pair of common data lines to selected one of plural memory cells and for feeding the data signals to be read out, which are then generated from the selected memory cell, through the common data lines to a read out circuit, there exists a relative high parasitic capacity in the paired common data lines so that the signals having a level corresponding to the previous data signals are held in the paired common data lines.

The memory cell selected upon the reading operation establishes such a potential in the paired common data lines as accords to the data signals stored therein. However, a memory cell usually has a reduced drive capacity for a capacitive load because an IC circuit of semiconductor is reduced in size for high integration and for low power consumption.

Therefore, when it is necessary that the potential held at one level in the common data lines be considerably changed to another level by one memory cell, e.g., in case the data signals are written in another memory cell and then are read out of the aforementioned one memory cell, it takes a relatively long time. As a result, the time for reading out the data signals becomes long.

In order to prevent the reduction in the operating rate, it is desired that the respective potentials of the paired data lines be forcibly set in advance in the vicinity of the steady potential which is determined by the memory cells.

SUMMARY OF THE INVENTION

It is therefore an object of the present invention to provide a novel data line potential setting circuit for forcibly setting the potential of a pair of data lines at a predetermined level.

Another object of the present invention is to provide a novel data line potential setting circuit for forcibly reducing the potential difference between the paired data lines.

Still another object of the present invention is to provide an improved data line potential setting circuit which can shorten the time for setting the potential.

A further object of the present invention is to provide an improved data line potential setting circuit for setting the potential at a proper level.

A further object of the present invention is to provide an MIS memory circuit which can operate at a high speed.

Other objects of the present invention will become apparent from the following description made with reference to the accompanying drawings.

According to the present invention, the potential of a pair of data lines is forcibly set at a substantially intermediate level between a first or second level, before it is set at the first or second level by a signal feed circuit such as a memory cell, by the action of either switching means for short-circuiting the data lines or switching means for short-circuiting the respective data lines to preset bias voltage terminals.

Thus, it is sufficient that the signal feed circuit merely impart a small level displacement to the paired data lines. As a result, the potential of the paired data lines is made to reach a preset level within a short time by the action of the signal feed circuit.

DESCRIPTION OF THE PREFERRED EMBODIMENTS

Figure 1:
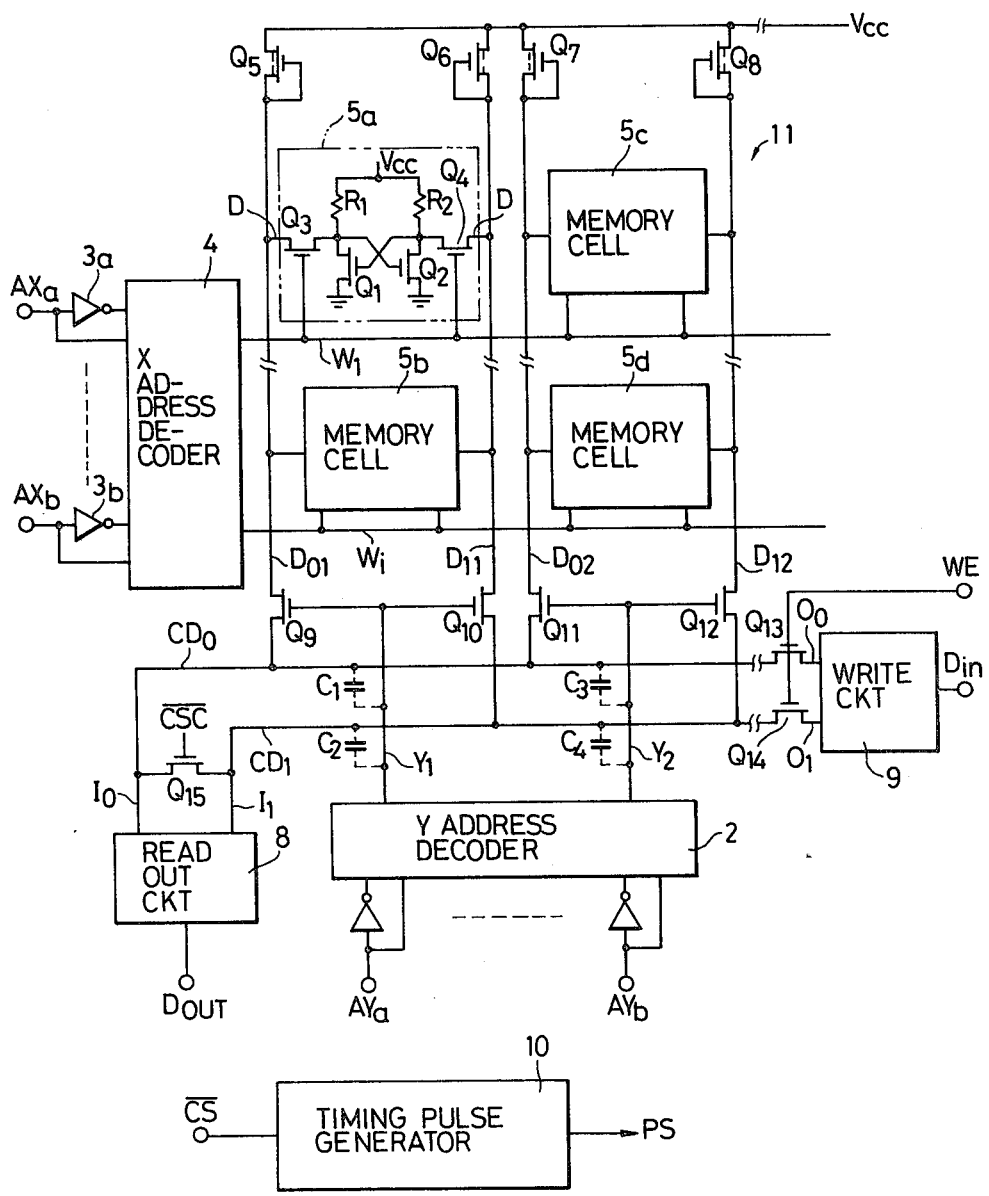
FIG. 1 is a circuit diagram showing an MIS memory circuit using a data line potential setting circuit according to one embodiment of the present invention.

In an MIS memory circuit according to one embodiment of the present invention, as shown in FIG. 1, reference numeral 11 indicates a memory matrix which is composed of a plurality of memory cells $5a$ to $5d$ arranged in a matrix form, word lines $W_1$ to $W_i$ and paired digit lines $D_{01}$ and $D_{11}$, and $D_{02}$ and $D_{12}$.

Each of the memory cells, i.e., the memory cell $5a$ is composed, as shown as a representative, of MIS FETs $Q_1$ and $Q_2$ and their load resistors $R_1$ and $R_2$ constituting together a flip-flop circuit, and MIS FETs $Q_3$ and $Q_4$ for transmission gates. These transmission gate MIS FETs $Q_3$ and $Q_4$ have their gate electrodes used as the selective terminals of their memory cell and their drain electrodes D used as a pair of input and output terminals.

The memory cells arranged in the same line, e.g., the memory cells $5a$ and $5c$ have their respective selective terminals connected commonly with the word line $W_1$ corresponding to that line.

On the other hand, the memory cells arranged in the same row, e.g., the memory cells $5a$ and $5b$ have their respective input and output terminals connected commonly with the paired digit lines $D_{01}$ and $D_{02}$ corresponding to that row.

MIS FETs $Q_5$ to $Q_8$ of depression mode, which have their gates and sources connected, are connected as load means between the respective digit lines $D_{01}$, $D_{11}$, $D_{02}$ and $D_{12}$ and a power terminal $V_{CC}$. The load means for the digit lines are used for reading out the data signals coming from the memory cells, as will be described later. The load resistors $R_1$ and $R_2$ of the respective memory cells are made to have high resistances so as to reduce the power to be consumed during the data holding operations, whereas the load means connected with the aforementioned digit lines are made to have relatively lower resistances for the reading operations.

In FIG. 1 and Figures as will appear hereinafter, the MIS FETs of depression modes are indicated in different symbols from those of the MIS FETs of enhancement mode by adding broken lines between the source and the drain, as shown.

The aforementioned respective digit lines $D_{01}$, $D_{11}$, $D_{02}$ and $D_{12}$ are further connected, as shown, with common data lines $CD_0$ and $CD_1$ through MIS FETs $Q_9$ and $Q_{12}$ each constituting a transmission gate circuit.

Indicated at numeral 4 is an X address decoder which is made operative to receive address signals from an address input terminal $AX_a$ or $AX_b$ through an address buffer circuit $3a$ or $3b$ and to select one of the plural word lines $W_1$ to $W_i$.

In accordance with the embodiment under consideration, although not limitative, in order to reduce the power consumption of the circuits surrounding the memory matrix of the address decoder or the like, each of the logic blocks constituting the peripheral circuits is equipped with an MIS FET acting as a power switch, which is controlled in accordance with the power switch signals prepared on the basis of chip selecting signals. The MIS FET for the power switch is rendered inconductive upon non-selection of chip so that its power consumption is reduced.

Figure 2:
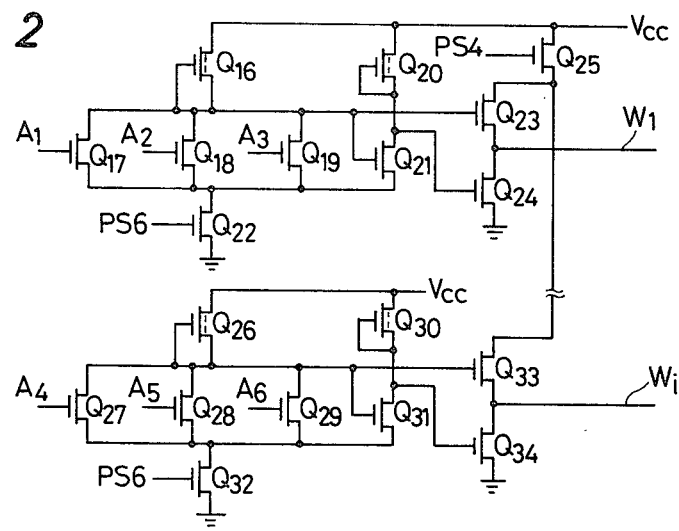
FIG. 2 is a concrete circuit diagram showing a block 4 of FIG. 1.

FIG. 2 shows in detail an example of the X address decoder 4 of FIG. 1. The block for selecting the word line $W_1$ is composed of MIS FETs $Q_{16}$ to $Q_{24}$. A NOR gate is constructed of the MIS FET $Q_{16}$ acting as a depression load and the enhancement MIS FETs $Q_{17}$ to $Q_{19}$ having their input terminals $A_1$ to $A_3$ supplied with the outputs of the address buffer circuit $3a$ or $3b$ of FIG. 1. Moreover, an inverter circuit is composed of the depression load MIS FET $Q_{20}$ and the enhancement MIS FET $Q_{21}$ receiving the output of the aforementioned NOR circuit. Still moreover, a push-pull output circuit is composed of the enhancement MIS FET $Q_{23}$ receiving the output of the aforementioned NOR circuit and the enhancement MIS FET $Q_{24}$ receiving the aforementioned inverter circuit.

There is commonly provided between the NOR gate and inverter circuit and a reference potential point (or earth point) of the circuit the MIS FET $Q_{22}$ which is controlled by the power switch signals fed through a terminal PS6. Moreover, there is provided between the MIS FET $Q_{23}$ of the push-pull output circuit and the power terminal $V_{CC}$ a MIT FET $Q_{25}$ which is controlled by the power switch signals fed through a terminal PS4. The remaining blocks for selecting the word line $W_i$ are constructed in a similar manner.

The power switch signals at the aforementioned terminals PS4 and PS6 are generated by a timing pulse generating circuit 10. This timing pulse generating circuit 10 is made, although not limitative, to have the construction shown in FIG. 4. In response to the chip selecting signals at a terminal $\overline{PS}$, the power switch signals are generated at the aforementioned terminals PS4 and PS6.

The chip selecting condition is instructed by the low level of the signals fed to the aforementioned terminal $\overline{PS}$. In response to this signal level, the signals at the aforementioned terminals PS4 and PS6 are raised to a high level.

The chip non-selecting condition is instructed by the high level of the signals fed to the aforementioned terminal $\overline{PS}$. In response to this signal level, the signals at the aforementioned terminals PS4 and PS6 are broken to a low level.

As a result, during the chip selecting operation, the MIS FETs $Q_{22}$, $Q_{32}$ and $Q_{25}$ of the aforementioned X decoder are rendered conductive when the signals at the aforementioned terminals PS4 and PS6 assume the high level. At this time, for instance, if the address signals at the input terminals $A_1$ to $A_3$ are all at the low level, the signals at the word line $W_1$ are responsively raised to the high level. In other words, the word line $W_1$ is selected.

During the non-selection of chip, the aforementioned MIS FETs $Q_{22}$, $Q_{32}$ and $Q_{25}$ are rendered non-conductive by the low level of the signals at the terminals PS4 and PS6. Under this particular condition, the signals at the word lines $W_1$ to $W_i$ are at the low level.

Figure 3:
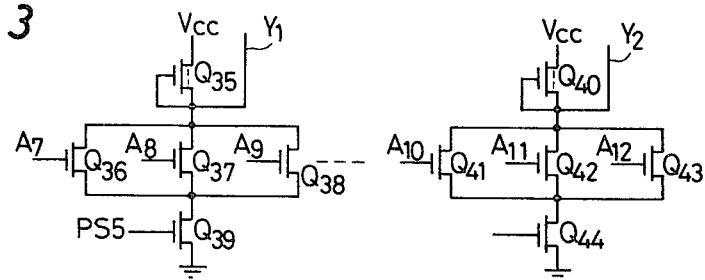
FIG. 3 is a concrete circuit diagram showing a block 2 of FIG. 1.

FIG. 3 shows in detail an example of the Y address decoder 2 of FIG. 1. Each of the blocks for generating selecting signals at their respective terminals $Y_1$ and $Y_2$ is composed, as exemplified at the left-hand circuit of the Drawing, of a NOR gate circuit, which in turn is composed of a depression load MIS FET $Q_{35}$ and enhancement MIS FETs $Q_{36}$ to $Q_{38}$ for receiving the outputs from the address buffer circuits $1a$ and $1b$ at their terminals $A_7$ to $A_9$, and an MIS FET $Q_{39}$ which is controlled by the power switch signals.

The power switch signals at the aforementioned terminal PS5 take the low level, upon the chip non-selection, similarly to those at the aforementioned terminals PS4 and PS6. As a result, upon the chip non-selection, the outputs $Y_1$ and $Y_2$ of the Y address decoder are raised to the high level.

In FIGS. 2 and 3, incidentally, although it is conceivable that the MIS FETs $Q_{22}$, $Q_{32}$, $Q_{39}$ and $Q_{44}$ acting as the power switch are provided at the side of the power terminal $V_{CC}$, this modification is not preferred because the output signal level is lowered, upon the operation of the decoder, by the threshold voltage of the MIS FETs acting as the power switch.

If, in order to prevent this difficulty, use is made of MIS FETs having a low threshold voltage, a leak current is liable to be established upon the non-selection thereby to make it difficult to reduce the power consumption upon the chip non-selection. From the reasoning thus far made, the MIS FETs acting as the power switch are preferably provided at the side of the reference potential.

Indicated at reference numeral 8 in FIG. 1 is a read out circuit which has its paired input terminals $I_0$ and $I_1$ connected directly with the aforementioned paired common data lines $CD_0$ and $CD_1$. Thus, the read out circuit 8 generates such data signals at its output terminal $D_{OUT}$ as accord to the potential difference between the signals fed to the aforementioned input terminals $I_0$ and $I_1$.

Numeral 9 indicates a write circuit. This write circuit 9 generates such signals of opposite phases at its paired output terminals $O_0$ and $O_1$ as accord to the data signals fed to an input terminal $D_{in}$. The output terminals $O_0$ and $O_1$ are connected, as shown, with the common data lines $CD_0$ and $CD_1$ through the MIS FETs $Q_{13}$ and $Q_{14}$. These MIS FETs $Q_{13}$ and $Q_{14}$ are rendered conductive and inconductive in response to the write control signals which are fed through a terminal WE.

In the memory circuit according to the embodiment under discussion, the read out circuit 8 can have a high input impedance because it is composed of the MIS FETs. On the other hand, the write circuit 9 has a relative low output impedance, and is separated from the common data lines, during the operations other than the writing operation, by the action of the MIS FETs $Q_{13}$ and $Q_{14}$. As a result, upon the non-selecting operation after the reading or writing operation, the reading or writing signals are held as they are in the common data lines $CD_0$ and $CD_1$.

This results in the aforementioned problem in case the stored information at the opposite level to the held one is to be read out. In order to solve this problem, according to the present invention, an MIS FET $Q_{15}$ acting as a two-ways switch is interposed between the paired common data lines $CD_0$ and $CD_1$, as shown. Thus, the paired common data lines $CD_0$ and $CD_1$ are made to have the same potential by rendering the MIS FET $Q_{15}$ conductive, upon the chip non-selection, in response to the control signals at a terminal $\overline{CSC}$.

As a result, in case the data signals are to be read out of the memory cell which is newly selected by the X decoder 4 and the Y decoder 2, the time period until the common data lines $CD_0$ and $CD_1$ reach a preset potential difference is shortened.

According to the embodiment being described, the control signals to be fed to the aforementioned terminal $\overline{CSC}$ can have a relatively high level, as will be explained in the following, because the MIS FET $Q_{15}$ is satisfactorily brought into its conductive condition.

More specifically, the Y address decoder 2 of the present embodiment is constructed to include the MIS FETs $Q_{39}$ and $Q_{44}$ acting as the power switch at the side of the reference potential terminal, as has been described. As a result, only the selected one of the Y address selecting lines $Y_1$ and $Y_2$ reaches its high level during the chip selection. During the chip non-selection, on the other hand, both of the selecting lines $Y_1$ and $Y_2$ assume their high level.

Figure 6:
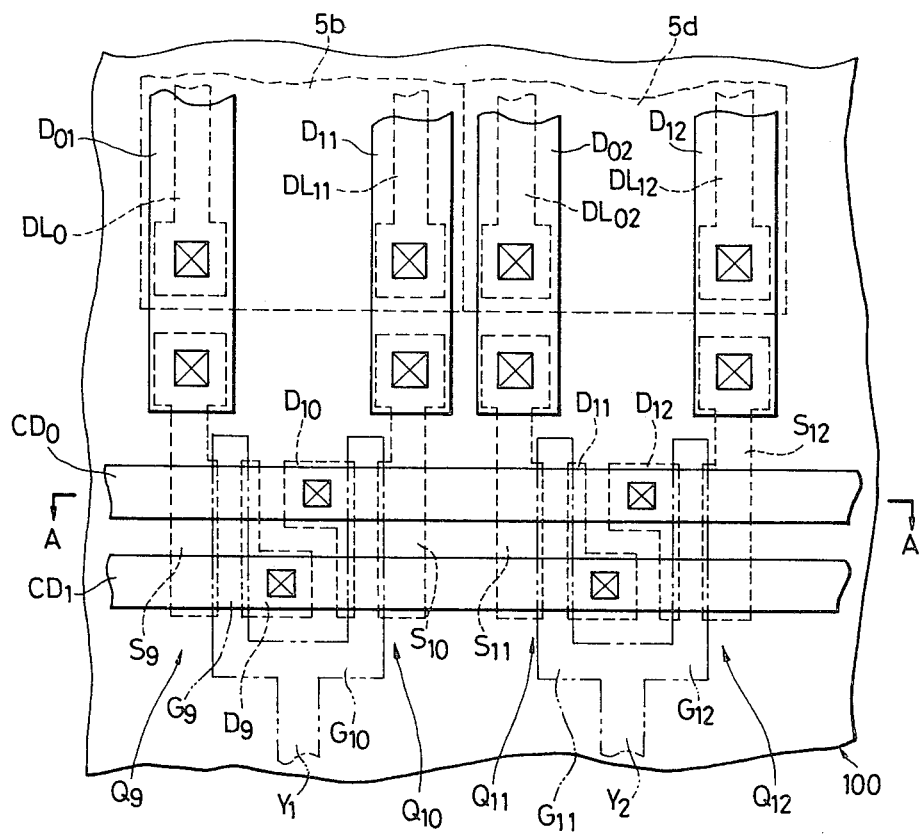
FIG. 6 is a top plan view showing an IC circuit device of semiconductor.
Figure 7:
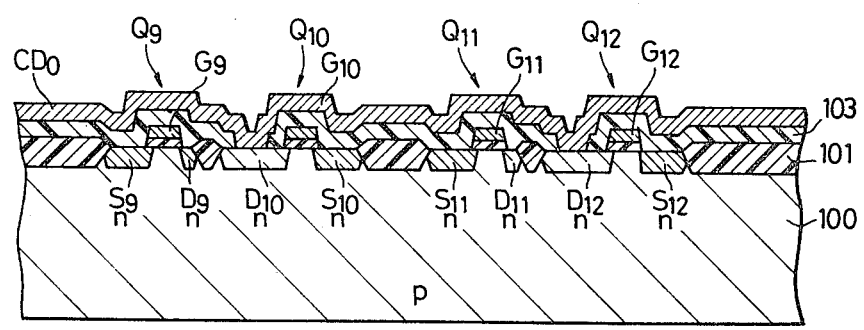
FIG. 7 is a section taken along line A—A of FIG. 6.

As will become apparent from the concrete structure of the semiconductor IC circuit shown in FIGS. 6 and 7, there exist relatively high parasitic capacities $C_1$ and $C_4$ between the Y address selecting lines $Y_1$ and $Y_2$ and the common data lines $CD_0$ and $CD_1$.

As a result, when the potentials of the both Y address selecting lines $Y_1$ and $Y_2$ are raised to the high level as the condition is shifted from the chip selection to the chip non-selection, the common data lines $CD_0$ and $CD_1$ are responsively changed to have the high potential by the combination between the parasitic capacities.

In order to render the aforementioned MIS FET $Q_{15}$, its gate potential has to be raised to a level higher than the threshold voltage of that common data line $CD_0$ or $CD_1$, which acts as a source of the MIS FET $Q_{15}$.

Therefore, the control signals at the terminal $\overline{CSC}$ are made to have the high level, as has been described in the above.

FIG. 6 is a top plan view showing a semiconductor integrated circuit (IC) which is formed with the digit lines, the common data lines, the Y address selecting lines and the MIS FETs. FIG. 7 is a section taken along line A—A of FIG. 6.

In FIG. 6, a p-type silicone substrate 100 is formed on its surface, as shown in broken lines, with n-type regions $DL_{01}$, $DL_{11}$, $DL_{02}$ and $DL_{12}$ for wiring the memory cells 5b and 5d, and n-type regions $S_9$ to $S_{12}$ and $D_9$ to $D_{12}$ for forming the source and drain regions of the MIS FETs $Q_9$ to $Q_{12}$. A gate electrode $G_9$, which is made of a polycrystalline silicone layer having such a pattern as shown in a single dotted line, is further formed on the p-type silicone substrate 100 between the n-type regions $S_9$ and $D_9$. Other gate electrodes $G_{10}$ to $G_{12}$ are further formed in a similar manner. A silicone oxide film 103 is formed on the whole surface including the surface of a thick silicone oxide film 101. The oxidized film 103 is formed with holes so as to form the wiring layers $D_{01}$, $D_{11}$, $D_{02}$, $D_{12}$, $CD_0$ and $CD_1$ which are made of aluminum or the like.

The wiring layer $D_{01}$ is made to contact, at the positions indicated at X marks in FIG. 6, with the n-type region $DL_{01}$ of the memory cell 5b and the source region of the MIS FET $Q_9$, thus constituting the digit line $D_{01}$ of FIG. 1. Likewise, the wiring layers $D_{11}$, $D_{02}$ and $D_{12}$ constitute the digit lines $D_{11}$, $D_{02}$ and $D_{12}$ of FIG. 1, respectively.

The wiring layer $CD_0$ is made to contact with the n-type regions $D_{10}$ and $D_{11}$ thereby to constitute the common data line $CD_0$ of FIG. 1. Likewise, the wiring layer $CD_1$ constitutes the other common data line $CD_1$ of FIG. 1.

On the other hand, the wiring layers $CD_0$ and $CD_1$ are made to intersect the gate electrodes $G_9$ to $G_{12}$ through the relatively thin oxide film 103.

As a result, the wiring layers $CD_0$ and $CD_1$ and the gate electrodes $G_9$ to $G_{12}$ are mutually connected through the parasitic capacities $C_1$ to $C_4$ (which should be referred to FIG. 1).

Figure 4:
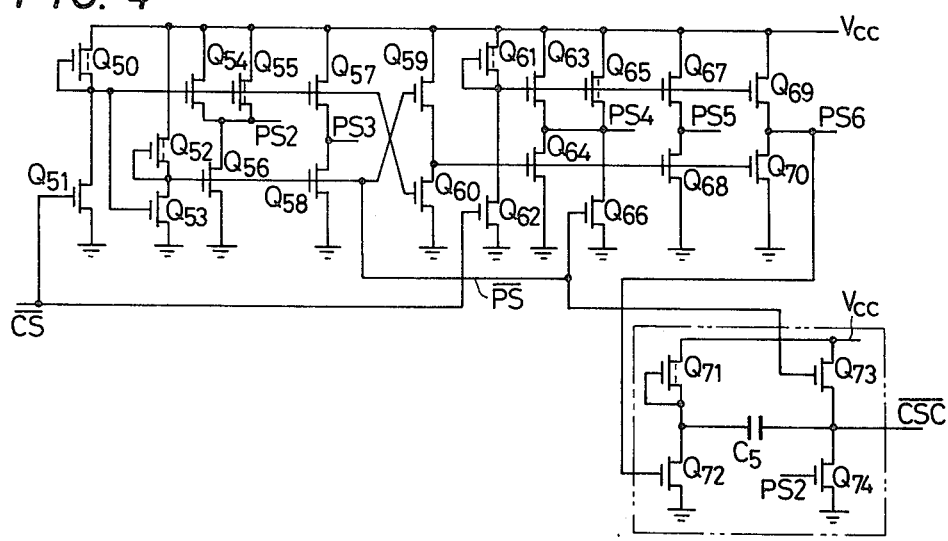
FIG. 4 is a concrete circuit diagram showing a block 10 of FIG. 1.

As shown in FIG. 4, according to the embodiment being considered, the control signals are fed to the aforementioned terminal $\overline{CSC}$ from the circuit, which is composed of a load MIS FET $Q_{71}$, a drive MIS FET $Q_{72}$ connected in series with the MIS FET $Q_{71}$, an active load MIS FET $Q_{73}$, a drive MIS FET $Q_{74}$ connected in series with the MIS FET $Q_{73}$ and a bootstrap capacitor $C_5$.

The MIS FET $Q_{72}$ has its gate supplied through the terminal PS6 with the power switch signals which are in opposite phase to the chip selecting signals to be fed to a terminal $\overline{CS}$ and which are relatively delayed. The MIS FET $Q_{73}$ has its gate supplied through a terminal $\overline{PS}$ with the power switch signals which are substantially similarly processed to the chip selecting signals. On the other hand, the MIS FET $Q_{74}$ has its gate supplied through a terminal PS2 with the power switch signals which have a relatively quick timing.

With the aforementioned construction, under the chip selecting condition, the aforementioned MIS FETs $Q_{72}$ and $W_{74}$ are conductive. As a result, the potential of the terminal $\overline{CSC}$ is at the low level which is substantially equal to the reference potential (or earth potential).

When shift is made from the chip selecting condition to the chip non-selecting condition, the MIS FET $Q_{73}$ is first rendered conductive, and the MIS FET $Q_{74}$ is then rendered inconductive. As this time, the MIS FET $Q_{72}$ is still conductive so that the capacitor $C_5$ is charged up. After a slight time delay, the MIS FET $Q_{72}$ is rendered inconductive. Under this particular condition, a voltage substantially equal to the supply voltage is fed to one terminal of the capacitor $C_5$ through the load MIS FET $Q_{71}$ so that the output signals at the terminal $\overline{CSC}$ reach a high level (i.e., 2 $V_{CC}$) twice of the supply voltage level.

The operations of the complete static MIS memory circuit having the surrounding circuit such as the decoder equipped with the power switch thus far described will be explained in detail with reference to the diagram of the operating waveforms shown in FIG. 5.

At time $t_0$, in response to the high level of the chip selecting signals $\overline{CS}$, the memory circuit is brought into its inconductive condition. In response to the chip selecting signals, the power switch signals at the terminals PS5 and PS6 are changed at times $t_4$ and $t_5$, respectively, from the high to low levels. As a result, the operations of the surrounding circuit such as the aforementioned address decoders are interrupted.

If, in this instance, the previous operations are of the reading mode, the signals at the previous reading level are held in the common data lines $CD_0$ and $CD_1$. These reading level signals have their held level raised by the bootstrap effects which are obtained by turning off the power switch.

The MIS FET $Q_{15}$ is rendered conductive in response to the control signals at the high level, which are generated by the use of the power switch signals at the terminals PS2 and PS6. As a result, the potentials at the two common data lines $CD_0$ and $CD_1$ are changed to the same level.

If, on the other hand, the subsequent operations are of the reading mode and if the data to be read out correspond to the inverted signals of the data of the previous operations, the common data lines $CD_0$ and $CD_1$ have been changed at the same level in advance, as touched in the above, so that the potentials of the common data lines are determined at a high speed by the data signals of the memory cell selected. As a result, the speed of the reading operations is improved.

Figure 5:
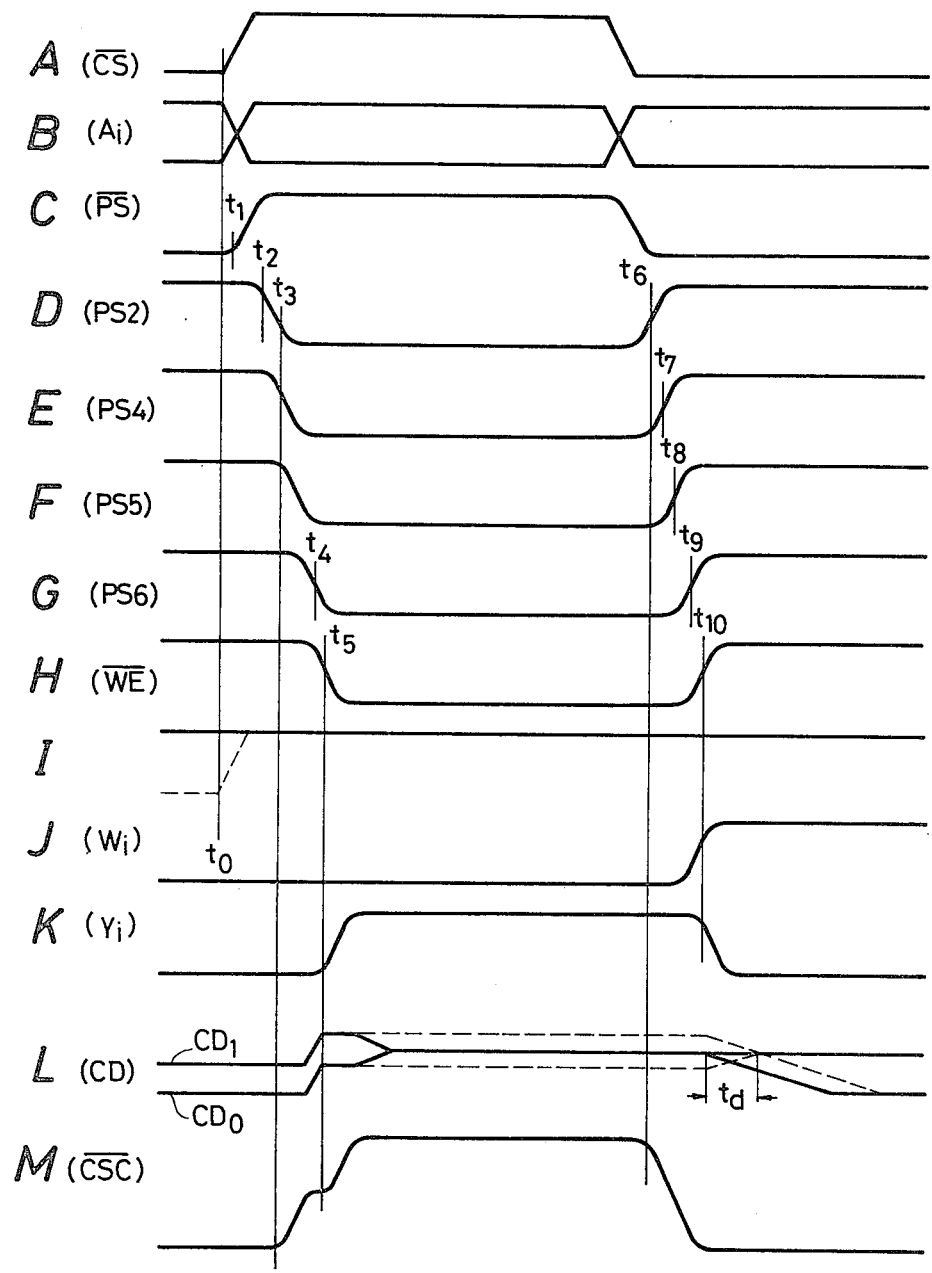
FIG. 5 is a waveform diagram showing the operating signals of the MIS memory circuit of FIG. 1.

In case, on the contrary, there is a level difference during the non-selection, as shown in broken lines in FIG. 5, time $t_d$ has to be waisted before the potentials of the common data lines are inverted in accordance with the data signals.

If, on the contrary, the previous operating cycle is of the writing type, the level difference between the common data lines is increased by the write cycle 9. Therefore, the time delay for the reversed reading purpose would be further augmented without the provision of the MIS FET $Q_{15}$. As a result, in case the data signals are written in one of the memory cells and are then read out from another memory cell, the effects obtainable according to the present embodiment should be highly appreciated.

Figure 8:
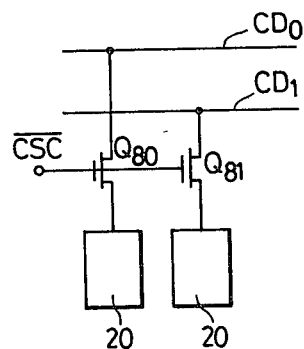
FIGS. 8 and 9 are circuit diagrams showing data line potential setting circuits according to other embodiments of the present invention, respectively.
Figure 9:
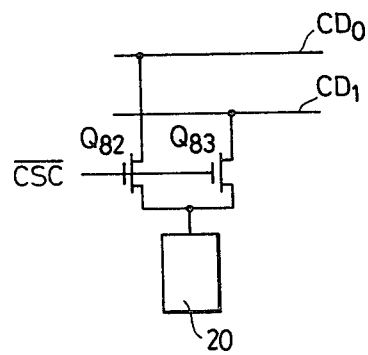
Figure 10:
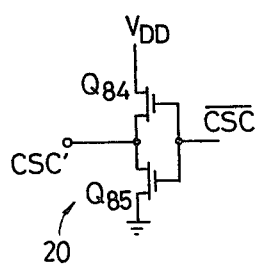
FIG. 10 is a concrete circuit diagram showing a bias voltage generating circuit for use in the circuits of FIGS. 8 and 9.

The present invention should not be limited to the embodiments thus far described but can be extended to a modification, as shown in FIGS. 8 and 9, in which MIS FETs $Q_{80}$, $Q_{81}$, $Q_{82}$ and $Q_{83}$ acting as switching means are provided in the paired common data lines $CD_0$ and $CD_1$ so that the same bias voltage may be generated from a circuit, e.g., a circuit 20 shown in FIG. 10 during the chip non-selecting operation.

Figure 11:
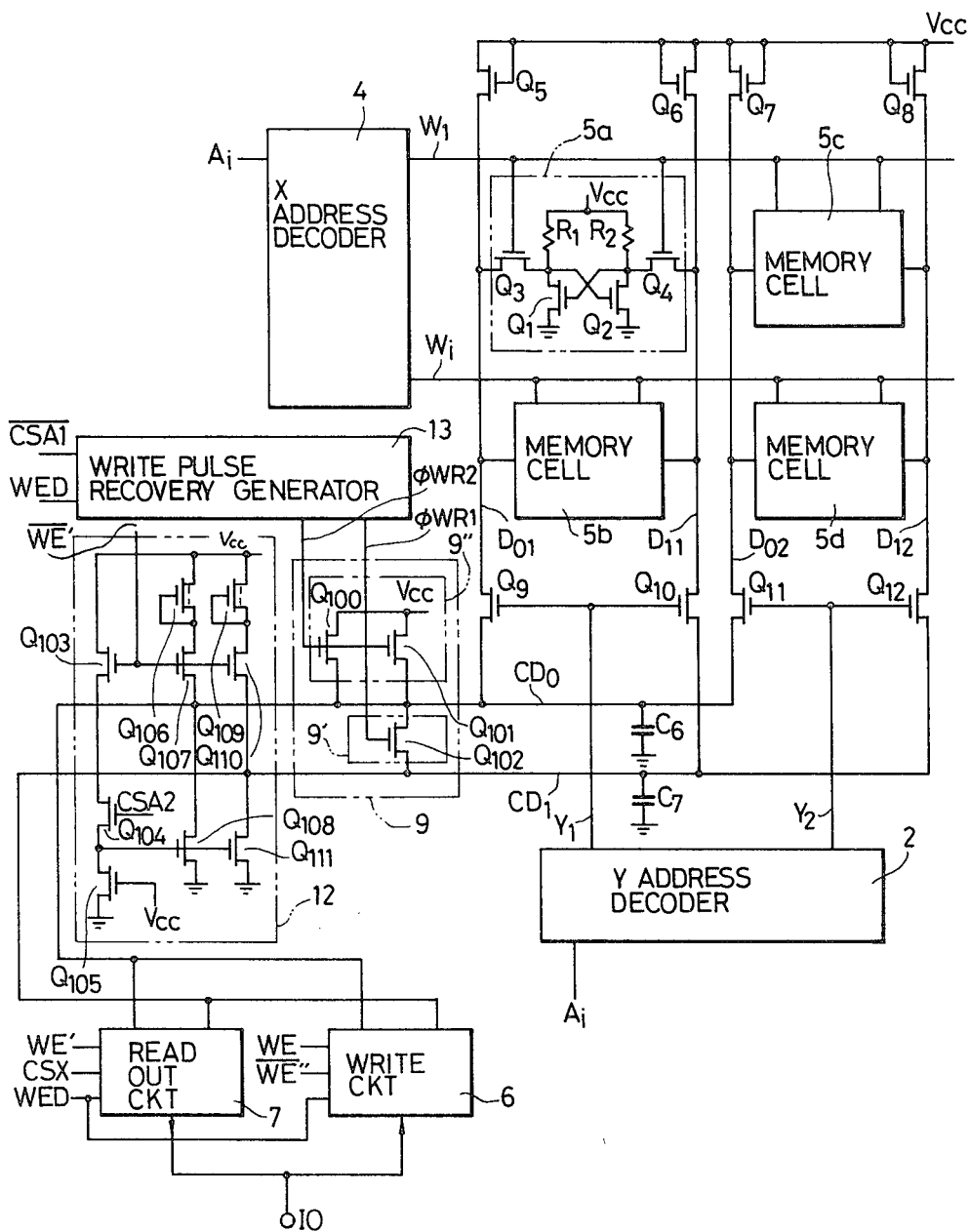
FIG. 11 is a circuit diagram showing an MIS memory circuit using a data line potential setting circuit according to another embodiment of the present invention.

FIG. 11 is a circuit diagram showing an MIS memory circuit equipped with a data line potential setting circuit according to another embodiment of the present invention.

In this embodiment, the paired common data lines $CD_0$ and $CD_1$ are connected with a data line potential setting circuit, which is composed of a first circuit 9 and a second circuit 12, the paired output terminals of the write circuit 6, and the paired input terminals of a read out circuit 7.

Although not limitative, the input terminal of the write circuit 6 and the output terminal of the read out circuit 7 are connected commonly with a single input and output terminal I/O.

Figure 12:
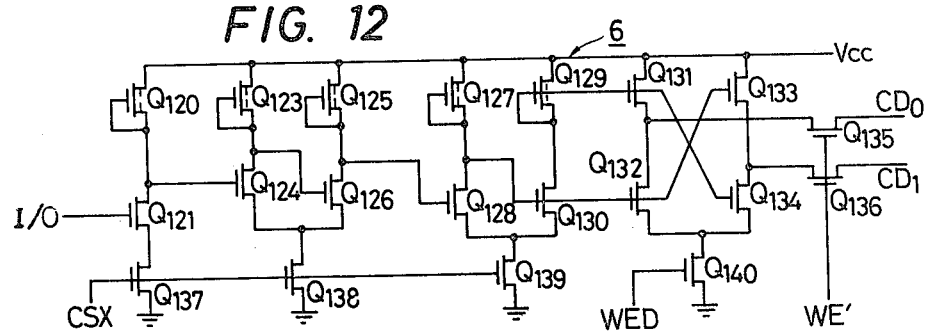
FIG. 12 is a concrete circuit diagram showing a block 6 of FIG. 11.

The write circuit 6 is composed, as shown in FIG. 12, of: a first inverter circuit for input buffer including MIS FETs $Q_{120}$ and $Q_{121}$; second and third inverter circuits for waveform shaping including MIS FETs $Q_{123}$ and $Q_{124}$, and $Q_{125}$ and $Q_{126}$, respectively; fourth and fifth inverter circuits for waveform shaping including MIS FETs $Q_{127}$ and $Q_{128}$, and $Q_{129}$ and $Q_{130}$, respectively; a first push-pull amplifier including MIS FETs $Q_{131}$ and $Q_{132}$; a second push-pull amplifier including MIS FETs $Q_{133}$ and $Q_{134}$; MIS FETs $Q_{135}$ and $Q_{136}$ for input data commutation connected between the output terminals of the first and second push-pull amplifiers and the common data lines $CD_0$ and $CD_1$, respectively; and MIS FETs $Q_{137}$ to $Q_{140}$ acting as a power switch.

The MIS FETs $Q_{137}$ to $Q_{139}$ acting as the power switch have their gates supplied with control signals through a terminal CSX, and the MIS FET $Q_{140}$ has its gate supplied with control signals through a terminal WED.

The foregoing respective control signals as well as various control signals which will be described later are fed from not-shown control circuits constructed in the MIS memory circuit, which is made receptive of the chip selecting signals from the outside through a not-shown terminal $\overline{CS}$ and of the writing control signals from the outside through a not-shown terminal $\overline{WE}$.

The time charts of the respective control signals are shown in FIGS. 15A to 15J.

The chip selecting signals at the terminal $\overline{CS}$, as shown in FIG. 15B, are made to instruct the chip non-selecting operation by their high level H and the chip selecting operation by their low level L.

The writing control signals at the terminal $\overline{WE}$, as shown in FIG. 15F, are made to instruct the reading operation by their high level H and the writing operation by their low level L.

A terminal $\overline{CSA1}$ is supplied, as shown in FIG. 15C, from the aforementioned control circuit with the control signals which are in phase with the chip selecting signals while having a timing delayed slightly from the same.

A terminal CSA2 is supplied, as shown in FIG. 15D, from the control circuit with the control signals which are in opposite phase to the signals at the terminal $\overline{SCA1}$ while having a timing delayed slightly from the same.

A terminal CSX is supplied, as shown in FIG. 15E, from the control circuit with the control signals which are in phase with the signals at the terminal CSA2 while having a timing delayed slightly from the same.

A terminal WE' is supplied, as shown in FIG. 15G, from the control circuit with the control signals which are raised to the high level in response to the low level of the writing control signals only when the chip selecting signals are the low level.

A terminal WED is supplied, as shown in FIG. 15H, from the control circuit with the control signals which have their rising time delayed slightly from that of the signals at the terminal WE' and their breaking time substantially coincident with that of the same signals.

A terminal $\overline{WE}''$ is supplied, as shown in FIG. 15I, from the control circuit with the control signals which are in opposite phase to the signals at the terminal WED and which are variable with a slight time delay from the same.

A terminal WE1 is supplied, as shown in FIG. 15J, from the control circuit with the control signals which are in opposite phase to the control signals at the terminal $\overline{WE}''$ and which are variable with a slight time delay from the same.

As a result, when the writing control signals are raised to the high level while the chip selecting signals are at the low level, the write circuit 6 shown in FIG. 12 feeds the differential signals according to the data signals at the input and output terminal I/O to the common data lines $CD_0$ and $CD_1$ through the data commutating MIS FETs $Q_{135}$ and $Q_{136}$. In other words, if the potential at the input and output terminal I/O is raised to the high level by the write circuit 6, one common data line $CD_0$ has its potential broken to the low level whereas the other common data line $CD_1$ has its potential raised to the high level.

Although not specially limited thereto, in case the supply terminal $V_{CC}$ is at a potential of +4.5 volts, the aforementioned write circuit 6 is so constructed as to increase the potential of one of the common data lines $CD_0$ and $CD_1$ to a high level of 3.8 volts and to decrease the potential of the other to a low level of 0.3 volts.

Figure 13:
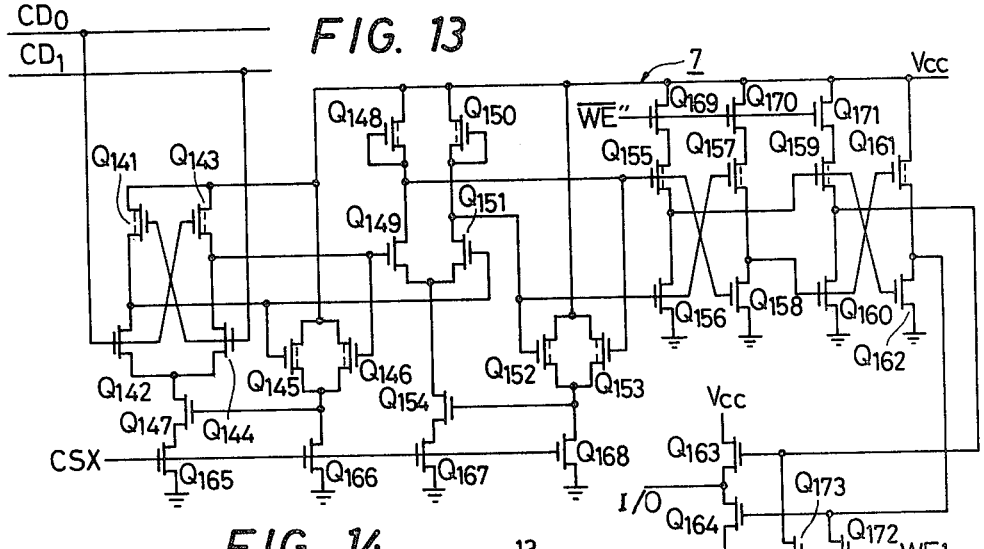
FIG. 13 is a concrete circuit diagram showing a block 7 of FIG. 11.

The read out circuit 7 is composed, as shown in FIG. 13, of: a first differential amplifier consisting of MIS FETs $Q_{141}$ to $Q_{144}$ and $Q_{147}$ to $Q_{165}$; a first compensator consisting of MIS FETs $Q_{145}$, $Q_{146}$ and $Q_{166}$ for detecting the output signal level of the first differential amplifier and for changing the same to a proper level; a second differential amplifier consisting of MIS FETs $Q_{148}$ to $Q_{151}$, $Q_{154}$ and $Q_{167}$; a second compensator consisting of MIS FETs $Q_{152}$, $Q_{153}$ and $Q_{168}$; first and second push-pull amplifiers consisting of MIS FETs $Q_{155}$ and $Q_{156}$, and $Q_{157}$ and $Q_{158}$, respectively; third and fourth push-pull amplifiers consisting of MIS FETs $Q_{159}$ and $Q_{160}$, and $Q_{161}$ and $Q_{162}$; an output push-pull circuit consisting of MIS FETs $Q_{163}$ and $Q_{164}$; MIS FETs $Q_{172}$ and $Q_{173}$ for try state; and MIS FETs $Q_{169}$ to $Q_{171}$ acting as the power switch.

The MIS FETs $Q_{165}$ to $Q_{168}$ of the first and second differential amplifiers and the first and second compensators are switched on and off by the control signals fed thereto through the terminal CSX.

In the read out circuit 7 thus constructed, if the control signals at the terminal WE1 are at the high level, the output MIS FETs $Q_{163}$ and $Q_{164}$ connected in series are rendered inconductive by the MIS FETs $Q_{173}$ and $Q_{172}$. As a result, the input and output terminal I/O is brought into a floating condition.

If the terminal WE1 have their control signals at the low level, on the contrary, one of the above output MIS FETs $Q_{163}$ and $Q_{164}$ is rendered conductive while the other is rendered inconductive in accordance with the differential signals between the common data lines $CD_0$ and $CD_1$. In other words, the output push-pull circuit generates the signals at the high or low level in accordance with the differential signals between the common data lines $CD_0$ and $CD_1$.

In the embodiment under consideration, if the load MIS FETs $Q_5$ to $Q_8$ connected with the respective digit lines $D_{01}$, $D_{11}$, $D_{02}$ and $D_{12}$ are suitably preset, that center level of the differential signals between the paired common data lines $CD_0$ and $CD_1$, which is determined by the memory cell selected, can be coincident with that center level of the differential signals between the common data lines $CD_0$ and $CD_1$, which is substantially determined by the write circuit 6.

The potentials at the common data lines $CD_0$ and $CD_1$, which are determined by the data signals of the selected memory cell, can assume levels, e.g., a high level of 2.8 volts and a low level of 2.5 volts because the load driving capacities of the MIS FETs $Q_1$ and $Q_2$ of the memory cell are restricted, as has been described.

As a result, the read out circuit 7 can have a sufficient sensitivity to the signals of small level difference between the common data lines $CD_0$ and $CD_1$.

As shown in FIG. 11, the first circuit 9 constituting the data line potential setting circuit is composed of: switching means 9' consisting of an MIS FET $Q_{102}$ which is connected between the common data lines $CD_0$ and $CD_1$; and current feed means 9" consisting of MIS FETs $Q_{100}$ and $Q_{101}$ which are connected between the supply terminal $V_{CC}$ and the aforementioned common data lines $CD_0$ and $CD_1$, respectively.

The MIS FET $Q_{102}$ has its gate supplied with switch control signals from a write recovery signal generating circuit 13 through a terminal $\phi$WR1. Likewise, the MIS FETs $Q_{100}$ and $Q_{101}$ have their gates supplied with the switch control signals through a terminal $\phi$WR2.

In the present embodiment, consideration is taken to make the reading operations at a high speed possible even in case the writing and reading operations are repeated during one continuous chip selecting period.

For this purpose, the switch control signals at the terminals $\phi$WR1 and $\phi$WR2 are raised to the high level for a preset period, as will become apparent from the concrete example of the write recovery signal generating circuit 13 of FIG. 14 which will be described later, even while the chip is being substantially selected, when the writing control signals are changed to their low to high level.

As a result, the MIS FET $Q_{102}$ connected between the common data lines $CD_0$ and $CD_1$ is rendered substantially conductive even during the chip selecting period.

As is different from the chip non-selecting period, during the chip selecting period, the potentials at the common data lines $CD_0$ and $CD_1$ can be prevented from being raised to an undesired high level by the combination between the parasitic capacities between the Y address selecting lines $Y_1$ and $Y_2$ and the common data lines $CD_0$ and $CD_1$.

During the chip selecting period, in other words, the potential at the common data line $CD_0$ or $CD_1$ acting as the source of the MIS FET $Q_{102}$ is at a relatively low level. As a result, the MIS FET $Q_{102}$ is conductive even for a relatively low gate potential.

In case, however, the high level signals at a relatively low potential are fed to the terminal $\phi$WR1, the MIS FET $Q_{102}$ will be operated at the saturated region $Z_2$ in the chracteristic curves of the drain-source voltage VDS plotted against the drain current IDS. In the saturated region $Z_2$, the drain current is under its saturated condition. As a result, it becomes difficult to take a balance between the potential, which is held in the parasitic capacity $C_6$ of the common data line $CD_0$, and the potential, which is held in the parasitic capacity $C_7$ of the common data line $CD_1$, within a short time by means of the MIS FET $Q_{102}$.

Figure 20:
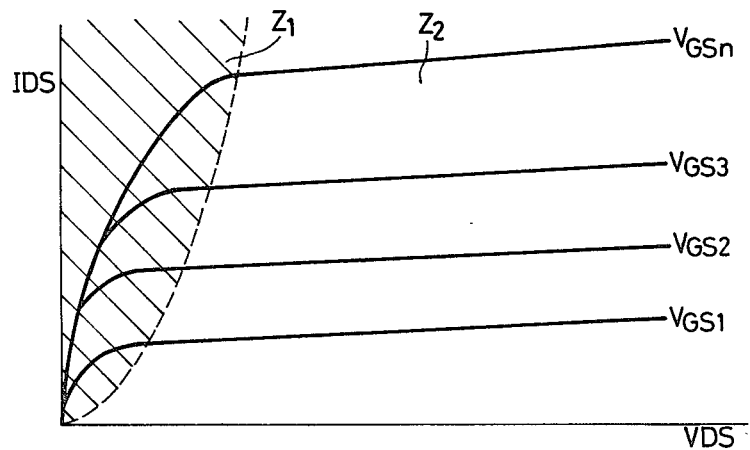
FIG. 20 is a diagram showing the operating characteristic curves of an MIS FET.

In the present embodiment, therefore, the signals to be fed to the terminal $\phi WR1$ are at such a sufficiently high level that the MIS FET $Q_{102}$ can be operated in the non-saturated region $Z_1$ in FIG. 20.

On the contrary, the MIS FETs $Q_{100}$ and $Q_{101}$ are operated substantially in the saturated region for the reasons, as follows.

More specifically, if the MIS FETs $Q_{100}$ and $Q_{101}$ were operated in the non-saturated region as in the case of the MIS FET $Q_{102}$, the potentials at the common data lines $CD_0$ and $CD_1$ would be raised to an excessively high potential substantially equal to the supply voltage within a relatively short period by their sufficiently low conductances. Since, in this instance, the read out circuit 7 is constructed, as has been described, to exhibit its excellent operating characteristics only for the input signals within a preset range, a relatively long period has to elapse before the potentials of the common data lines $CD_0$ and $CD_1$ are reduced to a level falling within a preset range by the memory cell selected.

From the above reasoning, the MIS FETs $Q_{100}$ and $Q_{101}$ are operated in the saturated region with a view to preventing the potentials at the common data lines $CD_0$ and $CD_1$ from rising to an undesired level.

Figure 14:
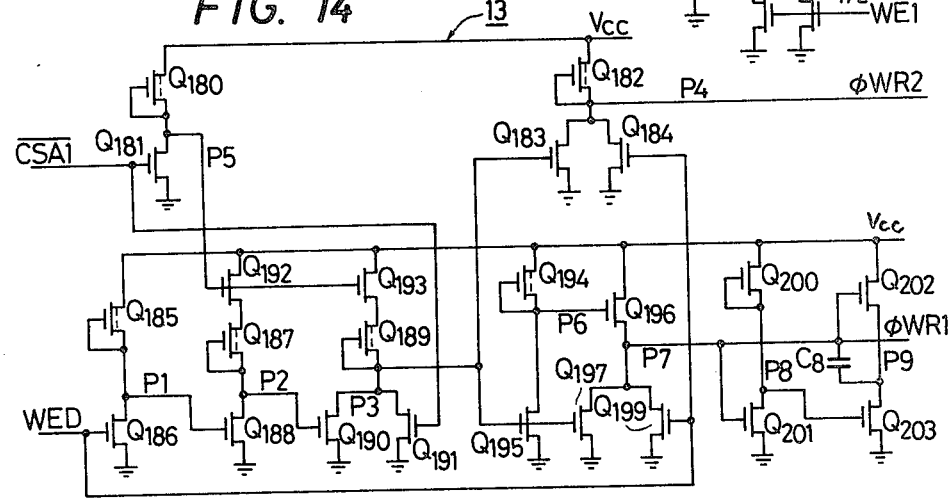
FIG. 14 is a concrete circuit diagram showing a block 13 of FIG. 11.

The write recovery signal generating circuit 13 is made to have a construction shown in FIG. 14.

In FIG. 14, a first inverter circuit is composed of MIS FETs $Q_{180}$ and $Q_{181}$. In response to the control signals generated on the basis of the chip selecting signals and fed through a terminal $\overline{CSA1}$, the first inverter circuit 13 generates its inverted signals at its terminal P5.

On the other hand, a second inverter circuit is composed of MIS FETs $Q_{185}$ and $Q_{186}$. In response to the control signals generated on the basis of the writing control signals and fed through a terminal WED, the second inverter circuit generates its inverted signals at its terminal P1.

Moreover, a third inverter circuit is composed of MIS FETs $Q_{187}$ and $Q_{188}$. This third inverter circuit has its operations restricted by the MIS FET $Q_{192}$ which is connected between the MIS FET $Q_{187}$ and the supply terminal $V_{CC}$.

On the other hand, a first NOR circuit having two input terminals is composed of MIS FETs $Q_{189}$ to $Q_{191}$. Similarly to the third inverter circuit, the first NOR circuit is also made to have its operations controlled by the MIS FET $Q_{193}$ which is connected between the MIS FET $Q_{189}$ and the supply terminal $V_{CC}$.

Moreover, a second NOR circuit having two input terminals is composed of MIS FETs $Q_{182}$ to $Q_{184}$.

On the other hand, a fourth inverter circuit is composed of MIS FETs $Q_{194}$ and $Q_{195}$, and a fifth inverter circuit is composed of MIS FETs $Q_{200}$ and $Q_{201}$.

Moreover, a third NOR circuit having two input terminal is composed of MIS FETs $Q_{196}$ and $Q_{199}$.

On the other hand, a bootstrap circuit is composed of MIS FETs $Q_{202}$ and $Q_{203}$ and a capacitor $C_8$.

The third NOR circuit is made, as is apparent from the Drawing, to have its input terminal common with that of the second NOR circuit so that it is made to accomplish similar operations to those of the second NOR circuit.

However, whereas the high level potential at the output terminal P4 of the second NOR circuit can be raised to a level substantially equal to the supply voltage at the highest, the high level potential at the output terminal P7 of the third NOR circuit can be raised to a level higher than the supply voltage by the action of the bootstrap circuit. Therefore the third NOR circuit employs as its load means the MIS FET $Q_{196}$ of enhancement mode which is rendered inconductive by the high level potential at the output terminal P7. The MIS FET $Q_{196}$ is driven by the signals obtainable at the output terminal P6 of the fourth inverter circuit.

If the signals at the terminal $\overline{CSA1}$ are at the high level in accordance with the chip non-selecting condition, the first NOR circuit has its MIS FET $Q_{191}$ responsively rendered conductive so that it generates low level signals at its output terminal P3.

Since, at this time, it is under the chip non-selecting condition, as has been described in the above, the signals obtainable at the terminal WED are at their low level.

As a result, the second NOR circuit receives the low level signals at its two input terminals through the terminals P3 and WED so that it generates its high level signals at its output terminal P4, i.e., $\phi WR2$.

At the same time, the third NOR circuit also generates its high level signals at its output terminal P4, i.e., $\phi WR1$. At this time, moreover, the fifth inverter circuit generates its low level signals at its output terminal P8 in response to the high level signals at the output terminal P7. The bootstrap circuit responds to the low level signals at the output terminal P8 and generates its high level signals at its terminal P9. As will become apparent from the later description, since the capacitor $C_8$ is charged up in advance, the high level signals at the output terminal P7 are boosted by the high level signals of the terminal P9 and the voltage stored in the capacitor $C_8$.

If the signals at the terminal $\overline{CSA1}$ are at the low level, the first inverter circuit responds thereto to generate its high level signals at its output terminal PS.

In response to the high level signals at the output terminal PS, the MIS FETs $Q_{192}$ and $Q_{193}$ are rendered conductive so that the third inverter circuit and the first NOR circuit are brought into operative conditions.

In the first NOR circuit, since the signals at the terminal $\overline{CSA1}$ are at the low level, as has been described in the above, the MIS FET $Q_{191}$ made receptive of one side input is under inconductive condition. As a result, the signal level at the output terminal P3 of the first NOR circuit is determined in accordance with the signal level at the output terminal P2 of the third inverter circuit.

If, at this particular time, the signals at the terminal WED are at their low level in response to the writing operation of the data signals in the memory cell, the signals at the terminal P1 of the second inverter circuit assume their high level whereas the signals at the output terminal P2 of the third inverter circuit assume their low level. In response to the low level of the signals at the output terminal P2, the signals at the output terminal P3 of the first NOR circuit assume their high level.

The second and third NOR circuits receive the high level signals through the output terminal P3 so that they generate their low level signals at their respective output terminals P4 and P7, i.e., $\phi WR2$ and $\phi WR1$.

If the signals at the terminal WED assume their high level in response to the writing operation of the data signals in the memory cell, the second and third NOR circuits responsively have their respective MIS FETs $Q_{184}$ and $Q_{199}$ rendered conductive so that the signals at the respective terminals $\phi WR2$ and $\phi WR1$ are broken to the low level. If, moreover, the signals at the terminal WED are raised to the high level, as described in the above, the signal at the output terminal P3 of the first NOR circuit are broken to the low level after such a delay time as is determined by the first and second inverter circuits and the first NOR circuit.

When the signals at the terminal WED are returned from their high to low levels in response to the termination of the writing operation of the data signals in the memory cell, the MIS FETs $Q_{184}$ and $Q_{199}$ of the second and third NOR circuits are rendered inconductive.

At this time, in response to the low level signals at the output terminal P3 of the first NOR circuit, the remaining MIS FETs $Q_{183}$ and $Q_{197}$ of the second and third NOR circuits are also rendered inconductive.

As a result, the second and third NOR circuits generate their high level signals at their respective terminals $\phi WR2$ and $\phi WR1$.

When the signals at the terminal WED are broken to the low level, as has been described before, the signals at the output terminal P3 of the first NOR circuit are raised to their high level after such a delay time as is determined by the first and second inverter circuits and the NOR circuit.

As a result, the second and third NOR circuits generate their high level signals at their respective terminals $\phi WR2$ and $\phi WR1$ for the above-specified delay time.

When the signals at the terminal $\phi WR1$ are changed from their low to high levels, as in the above, the signals at the output terminal P8 of the fifth inverter circuit are responsively changed from their high to low levels. Since, in this instance, delay in signals is established in the fifth inverter circuit, the MIS FETs in the bootstrap circuit are rendered conductive for the delay time of the first inverter circuit when the signals at the terminal $\phi WR1$ are raised to their high level. As a result, the capacitor $C_8$ is precharged by the high level signals at the terminal $\phi WR1$. After the delay time of the fifth inverter circuit, the MIS FET $Q_{203}$ is rendered inconductive. As a result, the signals at the terminal P9 of the bootstrap circuit are raised to their high level so that the signals at the $\phi WR1$ are raised to a higher level by the action of the capacitor $C_8$.

In the embodiment under discussion, the aforementioned first circuit 9 constituting the data line potential setting circuit is made operative to substantially equalize the potentials of the paired common data lines $CD_0$ and $CD_1$ at a high speed. With the construction show, however, it is difficult that the first circuit 9 operates to make the potentials at the paired common data lines $CD_0$ and $CD_1$ approach accurately to a desired level.

In order to eliminate this difficulty, the present embodiment employs a second circuit 12, which operates at a relatively low speed but can have an accurate set potential, in combination with the first circuit 9. Thanks to such construction, the potentials at the paired common data lines $CD_0$ and $CD_1$ can be varied at a high speed to the vicinity of the desired level by the action of the first circuit 9 and then varied up to the desired level by the action of the second circuit 12.

Reverting now to FIG. 11, the second circuit 12 is composed of: MIS FETs $Q_{106}$ and $Q_{107}$ connected in series between the supply terminal $V_{CC}$ and the common data line $CD_0$; MIS FETs $Q_{109}$ and $Q_{110}$ connected in series between the supply terminal $V_{CC}$ and the other common data line $CD_1$; MIS FETs $Q_{108}$ and $Q_{111}$ connected between the common data lines $CD_0$ and $CD_1$ and the reference potential terminal; and MIS FETs $Q_{103}$ and $Q_{105}$ connected in series between the supply terminal $V_{CC}$ and the reference potential terminal.

The MIS FETs $Q_{103}$, $Q_{107}$ and $Q_{111}$ have their gates supplied through the terminal $\overline{WE'}$ with the control signals, which are broken to the low level on the basis of the writing control signals, as has been described before, whereas the MIS FET $Q_{104}$ has its gate supplied through the terminal CSA2 with the control signals which are raised to the high level on the basis of the chip selecting signals, as has also been described.

The MIS FET $Q_{105}$ has its gate supplied with the supply voltage. On the other hand, the MIS FETs $Q_{108}$ and $Q_{111}$ have their gates supplied from the connecting point between the MIS FETs $Q_{104}$ and $Q_{105}$ with the control signals which are prepared in accordance with the control signals at the terminals $\overline{WE'}$ and CSA2.

In the second circuit 12, when the signals at the terminal $\overline{WE'}$ are raised to the high level, the MIS FETs $Q_{103}$, $Q_{107}$ and $Q_{110}$ are rendered conductive in response thereto. In response to the conduction of the MIS FET $Q_{103}$, moreover, there is generated between the drain and source of the MIS FET $Q_{105}$ a bias voltage which is operative to render the MIS FETs $Q_{108}$ and $Q_{111}$ conductive.

As a result, the MIS FETs $Q_{106}$ to $Q_{108}$ connected in series between the supply terminal $V_{CC}$ and the reference potential terminal start their operations. The potential at the common data line $CD_0$ is so varied as to coincide with the divided voltage which is built up by the MIS FETs $Q_{106}$ to $Q_{108}$. Likewise, the potential at the common data line $CD_1$ is varied as to coincide with the divided voltage which is built up by the MIS FETs $Q_{109}$ to $Q_{111}$ connected in series.

The respective divided voltages are set at such a value that they become coincident with that middle value within the digit line potential range, which is determined by the memory cell when the data signals are read out.

In the embodiment under consideration, the second circuit 12 is made also operative to act as the load means connected with the common data lines $CD_0$ and $CD_1$ when the data signals are read out of the memory cell selected.

The MIS FETs $Q_{106}$ to $Q_{111}$ of the second circuit 12 are made relatively small in size similarly to the load means $Q_5$ to $Q_8$, which are connected with the digit lines, with a view to preventing reduction in the level difference between the signals which are fed from the memory cell to the common data lines $CD_0$ and $CD_1$.

As a result, the potential varying rates at the common data lines $CD_0$ and $CD_1$, which are determined by the second circuit, can be relatively low, as has been described in the above.

Figure 15:
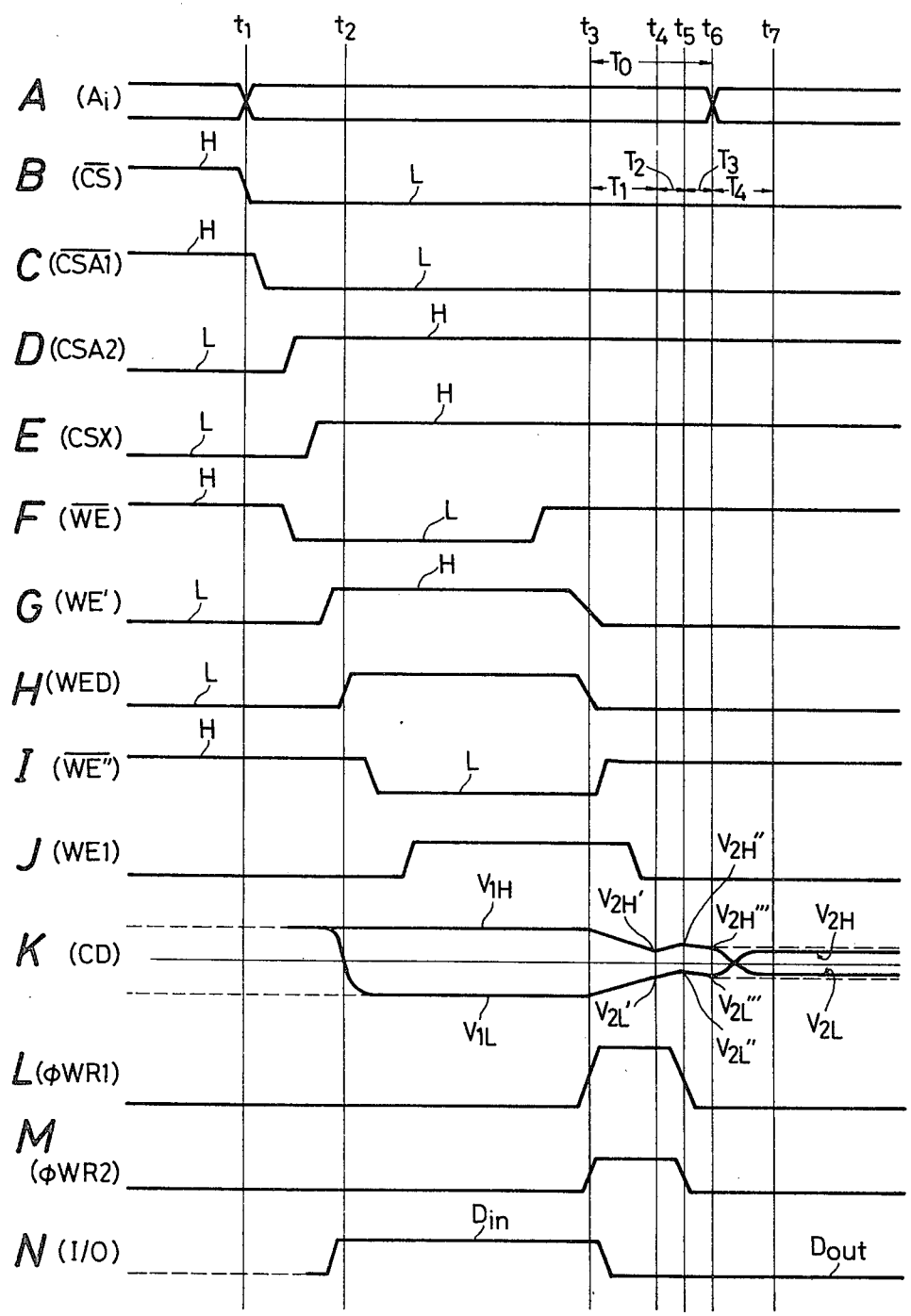
FIG. 15 is a waveform diagram showing the operating signals of the MIS memory circuit of FIG. 11.

FIG. 15 shows the timing chart of the memory circuit having the aforementioned construction.

At time $t_1$, the chip selecting signals at the terminal $\overline{CS}$ are broken, as shown in FIG. 15B, from their high level L to their low level L so as to invite the chip selecting condition.

At the same time, new address signals, e.g., the address signals for instructing the memory cell are fed to the address input terminal $A_i$ of the X address decoder 4 and the Y address decoder 2, as shown in FIG. 15A.

As a result, the word line $W_1$ as well as the Y address selecting line $Y_1$ has its potential raised to the high level. When the work line $W_1$ assumes the high level, the flip-flop circuit ($Q_1$, $Q_2$, $R_1$ and $R_2$) of the memory cell 5a is connected through the data transmitting MIS FETs $Q_3$ and $Q_4$ with the digit lines $D_{01}$ and $D_{11}$. On the other hand, when the Y address selecting line $Y_1$ assumes the high level, the digit lines $D_{01}$ and $D_{11}$ are connected through the MIS FETs $Q_9$ and $Q_{10}$ with the common data lines $CD_0$ and $CD_1$, respectively.

When the writing control signals at the terminal WE are broken to the low level, as shown in FIG. 15F, the signals at the terminal WE' assume the high level, as shown in FIG. 15G.

At time $t_2$, the signals at the terminal WED are raised to the high level, as shown in FIG. 15H.

As a result, the data signals for the writing operation are fed from the write circuit 6 of FIG. 12 through the data commutating MIS FETs $Q_{135}$ and $Q_{136}$ to the common data lines $CD_0$ and $CD_1$. If the data signals fed to the input and output terminal I/O are, for instance, at the high level, the common data line $CD_1$ has its potential raised to a high level of $V_{1H}$ whereas the other common data line $CD_0$ has its potential broken to a low level of $V_{1L}$, as shown in FIG. 15K. As has been described before, the high level of the common data lines, which is set by the write circuit 7, is a relatively high potential such as 3.8 volts whereas the low level of the same is a relatively low potential such as 0.3 volts.

As a result that the signals at the common data lines are fed to the memory cell 5a through the MIS FETs $Q_9$ and $Q_{10}$ and the digit lines, the MIS FETs $Q_1$ and $Q_2$ of the memory cell 5a are rendered conductive and inconductive, respectively.

Although not limited thereto, the high level of the data signals is made to correspond to one of the binary signals. In accordance with this, the conductive condition of the MIS FET $Q_1$ of the memory cell and the inconductive condition of the MIS FET $Q_2$ of the same are made to correspond to one of the binary signals.

When the control signals at the terminal WE' are returned at time $t_3$ to the low level, as shown in FIG. 15G, the common data lines $CD_0$ and $CD_1$ are electrically separated from the write circuit 6. In this instance, however, the common data lines $CD_1$ and $CD_0$ hold therein the high and low level potentials $V_{1H}$ and $V_{1L}$, which are fed during the above writing operation, by the actions of the parasitic capacities $C_6$ and $C_7$.

In the present embodiment, the control signals at the terminal WED are broken simultaneously with the signals at the terminal WE', as shown in FIG. 15H.

As a result, there are generated at the terminals $\phi$WR1 and $\phi$WR2 from the light recovery signal generating circuit 13 of FIG. 14 the control signals which are raised simultaneously with the break of the signals at the terminal WE', as shown in FIGS. 15L and 15M.

Although not specially limited thereto, according to the construction of FIG. 14, the potential of the signals at the terminal $\phi$WR2 is boosted to a level substantially equal to the supply voltage of 4.5 volts. On the contrary, the signals at the terminal $\phi$WR1 have their potential raised to a level substantially equal to $2(V_{CC}-V_{th})$, e.g., about 8.3 volts. In the above, incidentally, $V_{CC}$ stands for the supply voltage, whereas $V_{th}$ stands for the threshold voltage of the MIS FETs.

The MIS FET $Q_{102}$ of the first circuit 9 is brought into its conductive condition by the control signals at the terminal $\phi$WR1.

As a result, the charges in the parasitic capacity $C_7$ are fed through the MIS FET $Q_{102}$ to the parasitic capacity $C_6$ so that the potential at the common data line $CD_1$ is lowered whereas the potential at the other common data line $CD_0$ is raised, as shown in FIG. 15K.

The potentials at the common data lines $CD_0$ and $CD_1$, which are brought into their balanced condition by the action of the MIS FET $Q_{102}$, are made to coincide with the middle level between the high and low level signals which are generated from the write circuit 6.

Owing to the above circumstances, the memory cells are reduced in size so that their load driving capacity is restricted to a low level. As a result, the voltage drop, which is established in the load means of the digit lines by the memory cells, is accordingly restricted.

The potentials at the common data lines $CD_0$ and $CD_1$, which are set by the memory cells, are accordingly increased to a relatively high level.

The balanced potential at the common data lines $CD_0$ and $CD_1$, which are set only by the MIS FET $Q_{102}$, becomes lower than the potential at the same, which is set by the memory cells.

As a result, according to the present embodiment, the control signals obtainable at the terminal $\phi$WR2 render the MIS FETs $Q_{100}$ and $Q_{102}$ conductive and raise the potentials at the common data lines $CD_0$ and $CD_1$.

At time $t_4$, the potential difference between the potentials $V_2'$ and $V_{2H}'$ at the common data lines $CD_0$ and $CD_1$ is reduced to as low as a level of about 0.3 volts.

After time $t_4$, the potentials at the common data lines $CD_0$ and $CD_1$ are elevated by the MIS FETs $Q_{100}$ and $Q_{101}$.

At time $t_5$, the signals at the terminals $\phi$WR1 and $\phi$WR2 are returned to the low level, and the MIS FETs $Q_{100}$ to $Q_{102}$ of the first circuit 9 are rendered inconductive. At this time, the potentials at the common data lines $CD_1$ and $CD_0$ assume the levels of $V_{2H}''$ and $V_{2L}''$, as shown in FIG. 15K.

Prior to the time $t_5$, the second circuit 13 is brought in advance into its operating condition so that it operates to change the potentials at the common data lines $CD_0$ and $CD_1$ to a proper potential after the time $t_5$.

At time $t_7$, the address signals are so changed as to instruct the other memory cell to be read out.

As a result, the potentials at the common data lines $CD_0$ and $CD_1$ are determined by the memory cell which has been newly selected.

The data signals of the newly selected memory cell are read out at the time $t_7$ through the read out circuit 7.

FIGS. 16A to 16F, 17 and 18 show circuit diagrams of other embodiments according to the present invention, respectively.

Here, the terminals $\phi$WR1 and $\phi$WR2 in the foregoing Figures are supplied with switch signals for operating the MIS FETs under their unsaturated condition and with switch signals for operating the MIS FETs under their saturated condition from a circuit such as the circuit shown in FIG. 14.

Figure 16:
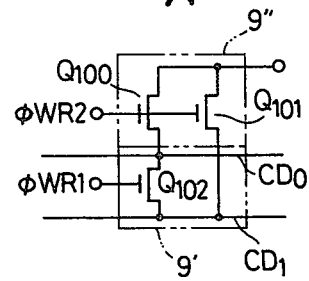
FIGS. 16A to 16F, FIG. 17 and FIG. 18 are circuit diagrams showing data line setting circuits according to other embodiments of the present invention, respectively.
Figure 16:
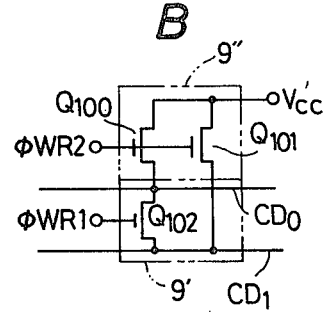
Figure 16:
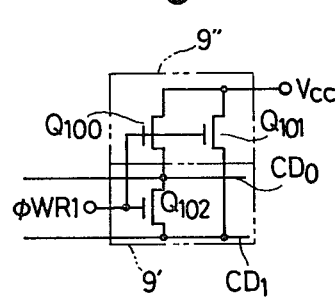
Figure 16:
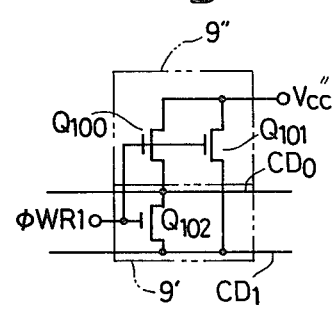
Figure 16:
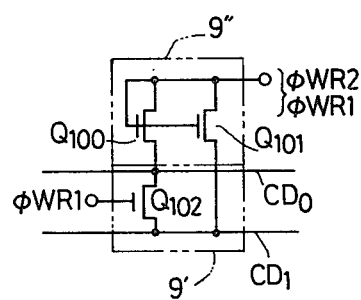
Figure 16:
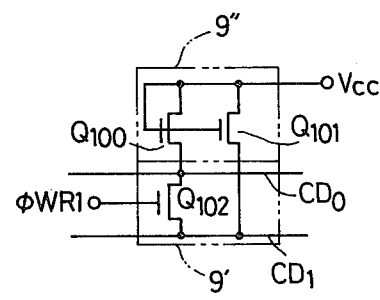

FIG. 16A shows the circuit of the type, in which the second circuit in the embodiment of FIG. 11 is dispensed with.

Figure 19:
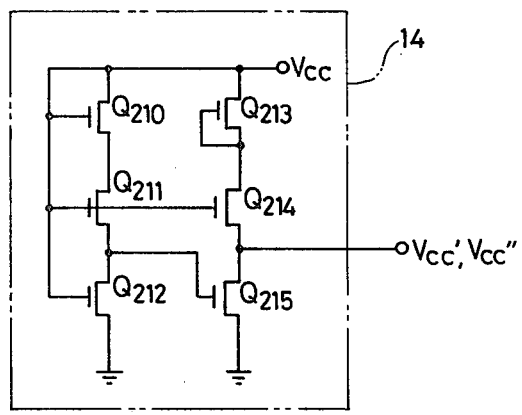
FIG. 19 is a circuit diagram showing a bias voltage generating circuit.

FIG. 16B shows a circuit for preventing the potentials at the common data lines $CD_0$ and $CD_1$ from rising to a level higher than a set voltage by feeding the bias voltage, which is limited to a level lower than the supply voltage, to the terminal $V_{CC}'$. The bias voltage is made equal to a level, for instance, the set voltage of the common data lines. The bias voltage can be generated, although not limited thereto, to the circuit shown in FIG. 19.

FIG. 16C shows a circuit for controlling the MIS FETs $Q_{100}$ to $Q_{102}$ in response to the high level switch signals to be fed to the terminal $\phi WR1$. By the use of this circuit, the MIS FETs $Q_{100}$ to $Q_{102}$ are operated under their unsaturated conditions so that the potentials at the common data lines can be promptly raised.

FIG. 16D indicates a circuit for feeding the high level switch signals to the MIS FETs $Q_{100}$ to $Q_{102}$ from the terminal $\phi WR1$ and for feeding the bias voltage, which is limited in a manner shown in FIG. 16B, to the terminal $V_{CC}'$.

FIG. 16E shows a circuit of the type, in which the MIS FETs $Q_{100}$ and $Q_{101}$ are connected at their gates and drains and in which the connected points are connected with the terminal $\phi WR1$ or $\phi WR2$.

FIG. 16F shows a circuit of the type, in which the MIS FETs $Q_{100}$ and $Q_{101}$ have their gates connected with the supply terminal $V_{CC}$. In the circuit shown in FIG. 16F, the MIS FETs are made conductive at all times. Therefore, the MIS FETs $Q_{100}$ and $Q_{101}$ are made to have their current supply capacities so reduced as to impart no restriction to the operations of other circuits such as the write circuit.

Figure 17:
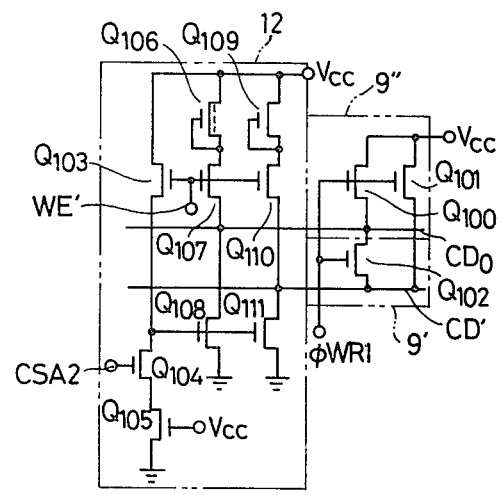

FIG. 17 shows a circuit of the type, in which the first circuit 9 to be combined with the second circuit 12 is made to have such construction as shown in FIG. 16C.

Figure 18:
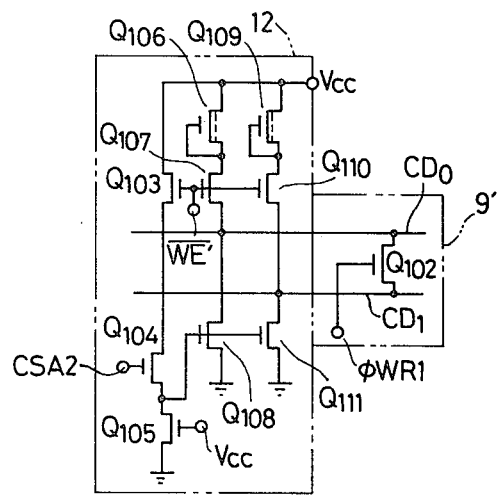

FIG. 18 shows a circuit of the type, in which the first circuit 9 to be combined with the second circuit 12 is made to consist of the MIS FET $Q_{102}$.

The present invention should not be limited to the foregoing respective embodiments. For instance, the second circuit 12 according to the embodiment of FIG. 11 can be combined with the respective circuits shown in FIGS. 16A to 16F.

Moreover, the MIS FETs $Q_{100}$ to $Q_{102}$ can be replaced by a bipolar transistor.

On the other hand, the MIS FETs $Q_{100}$ to $Q_{102}$ may be in the depression mode although they are embodied in the enhancement mode. Moreover, the MIS FETs may be replaced by bipolar transistors, diodes or resistors. Still moreover, the MIS FETs may be replaced by a plurality of elements which are connected between the bias source and the data lines.

On the other hand, the second circuit 12 should not be limited to the shown embodiments but can be modified into a variety of circuits having the same functions.

We claim:

1. A data line potential setting circuit comprising: a switching means including a control terminal and first and second output terminals, the first output terminal being connected with one of paired data lines which are receptive of signals of opposite phases, respectively, the second output terminal being connected with the other of said paired data lines; and a control circuit having its output terminal connected with the control terminal of said switching means, whereby the potential difference between said data lines is reduced by rendering said switching means conductive.

2. A data line potential setting circuit according to claim 1, wherein said switching means is operated in a nonsaturated region.

3. A data line potential setting circuit according to claim 2, wherein said switching means includes an insulate gate field effect transistor which is rendered conductive by the control signals at a higher level than the threshold voltage of the potentials at the said paired data lines.

4. A data line potential setting circuit comprising: a first switching means including a control terminal and first and second output terminals, the first output terminal being connected with a reference voltage terminal, the second output terminal being connected with one of paired data lines which are receptive of signals of opposite phases, respectively; second switching means including a control terminal and first and second output terminals, the first output terminal being connected with said reference voltage terminal, the second output terminal being connected with the other of said paired data lines; and a control circuit having its output terminal connected with the control terminals of the first and second switching means, whereby the potentials at said paired data lines are forcibly changed to the voltage at said reference voltage terminal by rendering the first and second switching means conductive.

5. A data line potential setting circuit according to claim 4, further comprising third switching means including a control terminal and first and second output terminals, the first output terminal being connected with one of said paired data lines, the second output terminal being connected with the other of said paired common data lines, said control terminal being connected with the output terminal of said control circuit.

6. A data line potential setting circuit according to claim 5, wherein the first and second switching means are operated under their saturated conditions whereas the third switching means is operated under its not-saturated condition.

7. A data line potential setting circuit according to claim 5, the first to third switching means are made of an insulate gate field effect transistors, and wherein the insulate gate field effect transistor making up the third switching means is rendered conductive by the control signals at a higher level than the threshold voltage of the potentials at said paired data lines.

8. An MIS memory circuit comprising: a plural pairs of digit lines connected commonly with the input and output terminals of a plurality of memory cells, respectively; a pair of common data lines; a gate means for connecting one selected from said plural pairs of digit lines with said pair of common data lines; a write and read out circuits connected with said pair of common data lines; an insulate gate field effect transistor including a gate electrode and first and second output terminals, the first output terminal being connected with one of said pair of common data lines, the second output terminal being connected with the other of said pair of common data lines and a control circuit having its output terminal connected with the gate electrode of said insulate gate field effect transistor, whereby the potential difference between said pair of common data lines is reduced in advance by rendering said insulate gate field effect transistor before the reading operation of the data signals out of said memory cells is started.

9. An MIS memory circuit according to claim 8, wherein said MIS memory circuit is so constructed that it is controlled to a held condition and a stand-by condition by chip selecting signals, and wherein said control circuit is so constructed as to render said insulate gate field effect transistor conductive in response to the chip selecting signals at a level to instruct said held condition.

10. An MIS memory circuit comprising: a plural pairs of digit lines connected commonly with an input and output terminals of a plurality of a memory cells, respectively; a pair of common data lines; gate means for connecting one selected from said plural pairs of digit lines with said pair of common data lines; a wirte and read out circuits connected with said pair of common data lines; a first insulate gate field effect transistor including a gate electrode and first and second output terminals, the first output terminal being connected with a reference voltage terminal, the second output terminal being connected with one of said pair of common data lines; a second insulate gate field effect transistor including a gate electrode and first and second output terminals, the first output terminal being connected with said reference voltage terminal, the second output terminal being connected with the other of said pair of common data lines; and a control circuit having its output terminal connected with the gate electrodes of the first and second insulate gate field effect transistor, whereby the respective potentials at said pair of common data lines are forcibly changed to the potential at said reference voltage terminal by feeding the control signals at a high level from said control circuit to said gate electrodes before the reading operation of data signals out of said memory cells is started.

11. An MIS memory circuit according to claim 10, further comprising a third insulate gate field effect transistor including a gate electrode and first and second output terminals, the first output terminal being connected with one of said pair of common data lines, the second output terminal being connected with the other of said pair of common data lines, said gate electrode being connected with the output terminal of said control circuit.

12. An MIS memory circuit according to claim 11, wherein said MIS memory circuit is so constructed that it is controlled to a held condition and a stand-by condition by chip selecting signals, and wherein said control circuit is so constructed as to render the first to third insulate gate field effect transistors conductive in response to the chip selecting signals at a level to instruct said held condition.

13. An MIS memory circuit according to claim 11, wherein the first and second insulate gate field effect transistors are operated in their saturated regions whereas the third insulate gate field effect transistor is operated in its non-saturated region.

14. An MIS memory circuit according to claim 11, wherein said control circuit is so constructed as to feed the control signals at a higher level than the threshold voltage of the potentials at said pair of common data lines to the gate electrode of the third insulate gate field effect transistor.

15. An MIS memory circuit according to claim 11, wherein said control circuit is so constructed as to render the first to third insulate gate field effect transistors conductive for a predetermined time after the data signals are written in said memory cells.

16. An MIS memory circuit according to claim 11, further comprising voltage feed means connected with said pair of common data lines for feeding the middle potential within the potential range of said pair of common data lines, which is varied by said memory cells.

17. An MIS memory circuit according to claim 16, wherein said voltage feed means includes a fourth and fifth insulate gate field effect transistors connected between a supply terminal and said pair of common data lines and adapted to be rendered inconductive when the data signals are written in said memory cells.

* * * * *